United States Patent
Kohara et al.

(10) Patent No.: US 8,184,466 B2
(45) Date of Patent: May 22, 2012

(54) SEMICONDUCTOR STORAGE DEVICE AND ROM GENERATOR

(75) Inventors: Koji Kohara, Kanagawa (JP); Takehiko Hojo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 12/797,764

(22) Filed: Jun. 10, 2010

(65) Prior Publication Data

US 2011/0090729 A1    Apr. 21, 2011

(30) Foreign Application Priority Data

Oct. 19, 2009    (JP) ................................. 2009-240072

(51) Int. Cl.
*G11C 17/00* (2006.01)
(52) U.S. Cl. .............................. 365/104; 365/72; 365/98
(58) Field of Classification Search ................... 365/72, 365/98, 104
See application file for complete search history.

(56) References Cited

U.S. PATENT DOCUMENTS

| | | | |
|---|---|---|---|
| 6,125,054 A | 9/2000 | Yusa et al. | |
| 2002/0024831 A1* | 2/2002 | Yamaguchi et al. | 365/63 |
| 2008/0285326 A1* | 11/2008 | Alami et al. | 365/72 |

FOREIGN PATENT DOCUMENTS

JP    2003-067254    3/2003

* cited by examiner

*Primary Examiner* — Hoai V Ho
*Assistant Examiner* — Anthan Tran
(74) *Attorney, Agent, or Firm* — Turocy & Watson, LLP

(57) ABSTRACT

According to one embodiment, a semiconductor storage device includes a first memory cell, a second memory cell and a third memory cell. The first memory cell forms a connection path used for storage of data. The second memory cell varies a connection place from a connection place of the connection path formed in the first memory cell, and stores data different from the data stored in the first memory cell is stored. The third memory cell varies a connection place from the connection place of the connection path formed in the second memory cell, and stores data same as the data stored in the first memory cell is stored.

10 Claims, 7 Drawing Sheets

FIG.1A
|  |  | Col. | | | | | |
|--|--|--|--|--|--|--|--|
|  |  | 0 | 1 | 2 | 3 | 4 | 5 |
| Row | 3 | 1 | 0 | 1 | 0 | 1 | 0 |
|  | 2 | 0 | 1 | 0 | 1 | 0 | 1 |
|  | 1 | 1 | 1 | 1 | 1 | 1 | 1 |
|  | 0 | 0 | 0 | 0 | 0 | 1 | 1 |
FIG.1B
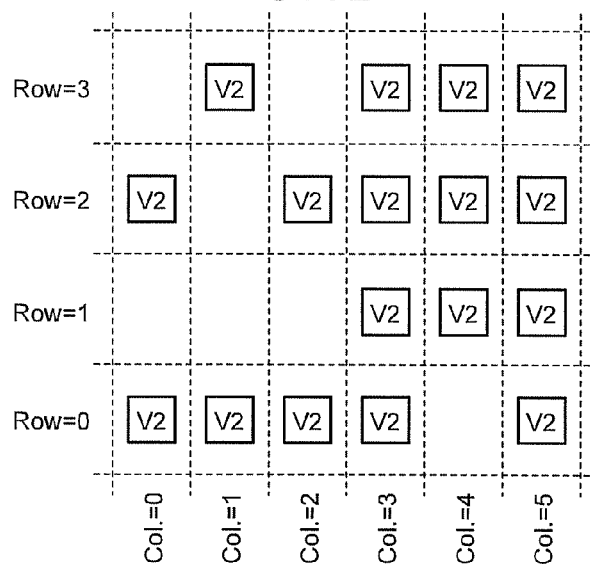
FIG.1C
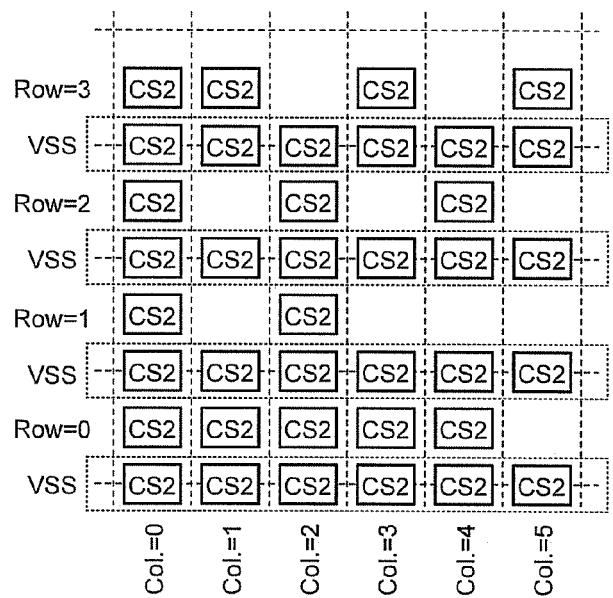

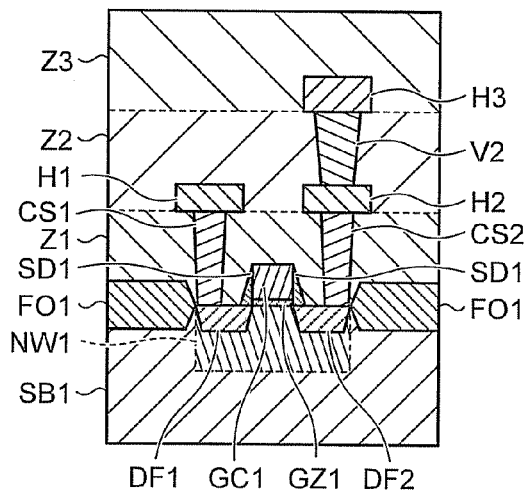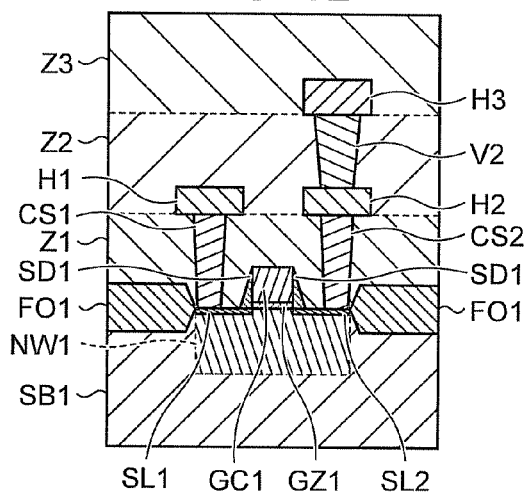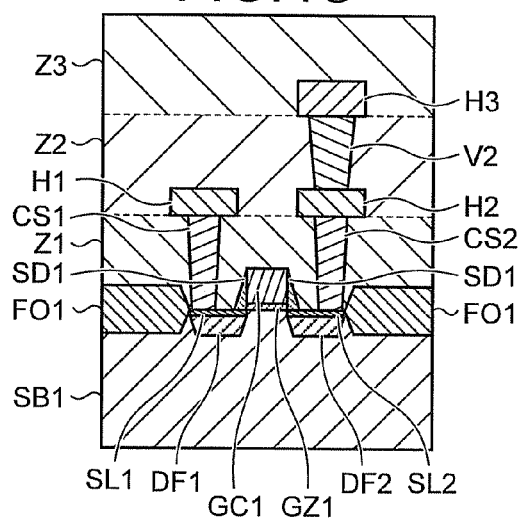

FIG.5A
| | | Col. | | | | | |
|---|---|---|---|---|---|---|---|
| | | 0 | 1 | 2 | 3 | 4 | 5 |
| Row | 3 | 1 | 0 | 1 | 0 | 1 | 0 |
| | 2 | 0 | 1 | 0 | 1 | 0 | 1 |
| | 1 | 1 | 1 | 1 | 1 | 1 | 1 |
| | 0 | 0 | 0 | 0 | 0 | 1 | 1 |
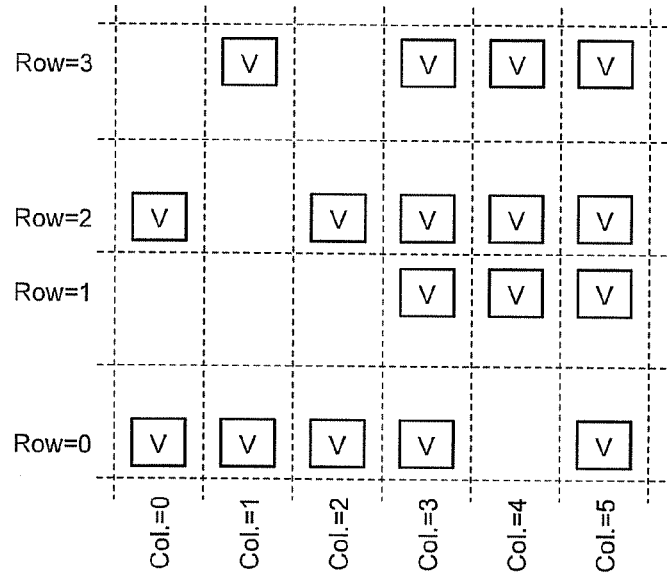
FIG.5B
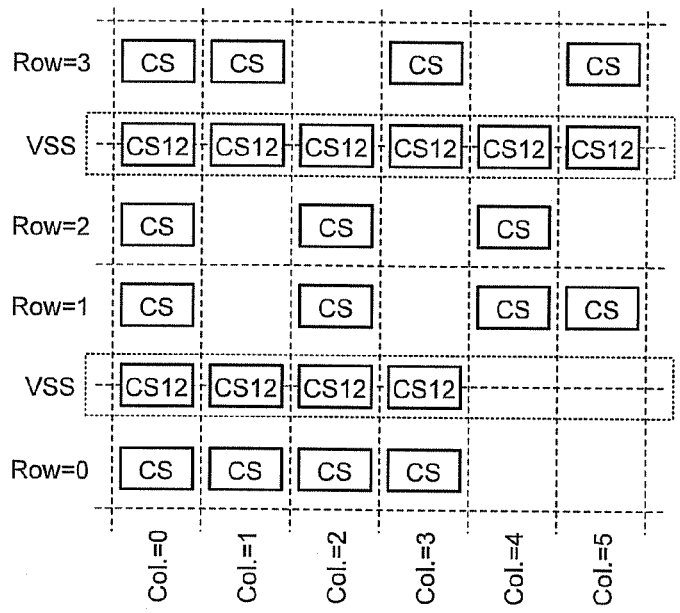
FIG.5C

US 8,184,466 B2

SEMICONDUCTOR STORAGE DEVICE AND ROM GENERATOR

CROSS-REFERENCE TO RELATED APPLICATIONS

This application is based upon and claims the benefit of priority from the prior Japanese Patent Application No. 2009-240072, filed on Oct. 19, 2009; the entire contents of which are incorporated herein by reference.

FIELD

Embodiments described herein relate generally to a semiconductor storage device and a ROM generator, and, more particularly is suitably applied to a method of making it difficult to decode ROM data from physical observation of a ROM chip.

BACKGROUND

In a read only memory (ROM) in the past, from the viewpoint of easiness in manufacturing or the like, ROM data is realized by presence or absence of contacts in a single layer. Because of easiness in changing the ROM data, contacts in higher metal wiring layers are used as much as possible and '0' and '1' of the ROM data are represented by presence or absence of contacts between metal layers.

For example, Japanese Patent Application Laid-Open No. 2003-67254 discloses a method of, to improve certainty of data readout protect for a ROM, reading out stored information from a region starting with an input address and having input length in the ROM, comparing the stored information with input information, and releasing the data readout protect for the ROM when the stored information and the input information coincide with each other.

However, in the ROM in the past, because the ROM data is realized by presence or absence of contacts in the single layer, the ROM data is relatively easily decoded by physically analyzing alignment of the contacts in the single layer. Therefore, the method is vulnerable in terms of security of the ROM chip.

BRIEF DESCRIPTION OF THE DRAWINGS

FIGS. 1A to 1C are plan views for explaining a method of forming a semiconductor storage device according to a first embodiment of the present invention;

FIGS. 4A to 4C are sectional views for explaining another example of the method of forming the memory cell applied to the semiconductor storage device according to the first embodiment;

FIGS. 5A to 5C are plan views for explaining a method of forming a semiconductor storage device according to a second embodiment of the present invention;

DETAILED DESCRIPTION

In general, according to one embodiment, a semiconductor storage device includes a first memory cell, a second memory cell and a third memory cell. The first memory cell forms a connection path used for storage of data. The second memory cell varies a connection place from a connection place of the connection path formed in the first memory cell, and stores data different from the data stored in the first memory cell is stored. The third memory cell varies a connection place from the connection place of the connection path formed in the second memory cell, and stores data same as the data stored in the first memory cell is stored.

Exemplary embodiments of a semiconductor storage device will be explained below in detail with reference to the accompanying drawings. The present invention is not limited to the following embodiments.

FIGS. 1A to 1C are plan views for explaining a method of forming a semiconductor storage device according to a first embodiment of the present invention. FIG. 1A is a diagram of an example of ROM data stored in the semiconductor storage device. FIG. 1B is a diagram of an arrangement example of contact electrodes V2 in a second layer. FIG. 1C is a diagram of an arrangement example of contact electrodes CS2 in a first layer.

It is assumed that, in FIG. 1, for example, memory cells are arranged in a matrix shape in four rows in a row direction and six columns in a column direction. It is assumed that the memory cells are separately connected to low-level potential VSS.

When the ROM data is '0', both the contact electrodes CS2 and V2 are arranged in the memory cells. When the ROM data is '1', the memory cells in which only the contact electrodes CS2 of the contact electrodes CS2 and V2 are arranged, the memory cells in which only the contact electrodes V2 of the contact electrodes CS2 and V2 are arranged, and the memory cells in which neither the contact electrodes CS2 nor the contact electrodes V2 are arranged are mixed.

FIGS. 2A to 2D are sectional views for explaining a method of forming a memory cell applied to the semiconductor storage device according to the first embodiment.

Figure 2A:
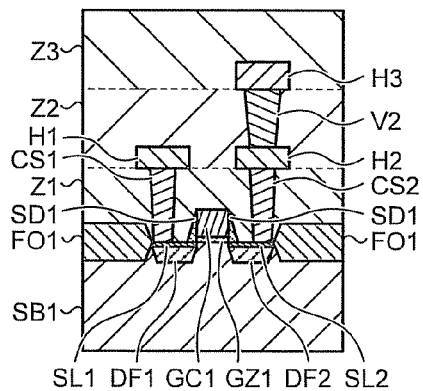
FIGS. 2A to 2D are sectional views for explaining a method of forming a memory cell applied to the semiconductor storage device according to the first embodiment.

In FIG. 2A, device isolation insulating films FO1 are formed on a semiconductor substrate SB1. Each memory cell is isolated by the device isolation insulating films FO1. A material of the semiconductor substrate SB1 can be selected out of, for example, Si, Ge, SiGe, GaAs, InP, GaP, GaN, SiC, and GaInAsP. As a material of the device isolation insulating films FO1, for example, a silicon oxide film can be used.

In a device forming region isolated by the device isolation insulating films FO1, an N well NW1 is formed in the semiconductor substrate SB1. A gate electrode GC1 is formed on the N well NW1 via a gate insulating film GZ1. A material of the gate insulating film GZ1 can be, for example, a silicon oxide film or can be a high dielectric film such as PZT. As a material of the gate electrode GC1, for example, a polysilicon film can be used.

Sidewalls SD1 are formed on the sidewalls of the gate electrode GC1. Diffusion layers DF1 and DF2 arranged on both sides of the gate electrode GC1 are formed in the semiconductor substrate SB1. Silicide layers SL1 and SL2 are respectively formed on the diffusion layers DF1 and DF2. As a material of the sidewalls SD1, for example, a silicon oxide film, a silicon nitride film, or the like is used. The silicide layers SL1 and SL2 can be formed of, for example, metal silicide of titanium, cobalt, nickel, or the like.

An interlayer insulating film Z1 is laminated on the gate electrode GC1. Wires H1 and H2 are formed on the interlayer insulating film Z1. Contact electrodes CS1 and CS2 that respectively connect the wires H1 and H2 to the silicide layers SL1 and SL2 are embedded in the interlayer insulating film Z1.

An interlayer insulating film Z2 is laminated on the wires H1 and H2. A wire H3 is formed on the interlayer insulating film Z2. A contact electrode V2 that connects the wire H3 to the wire H2 is embedded in the inter-layer insulating film Z2. An interlayer insulating film Z3 is laminated on the wire H3. As a material of the interlayer insulating films Z1 to Z3, for example, a silicon oxide film can be used. As a material of the wires H1 to H3, for example, a metal film of Al, Cu, or the like can be used. As a material of the contact electrodes CS1, CS2, and V2, for example, metal such as Al, Cu, or W can be used.

The wire H3 can be connected to a bit line BL, the gate electrode GC1 can be connected to a word line WL, and the wire H1 can be connected to the low-level potential VSS. In a configuration shown in FIG. 2A, '0' can be stored as the ROM data.

Figure 2B:
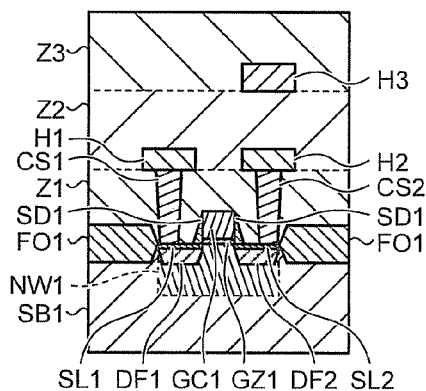
Figure 2C:
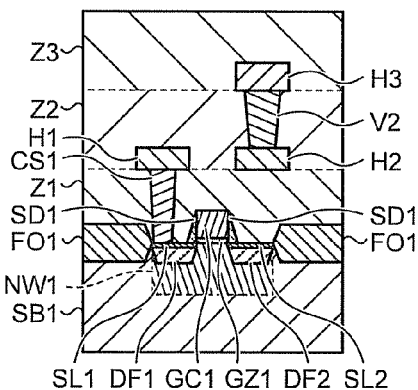
Figure 2D:
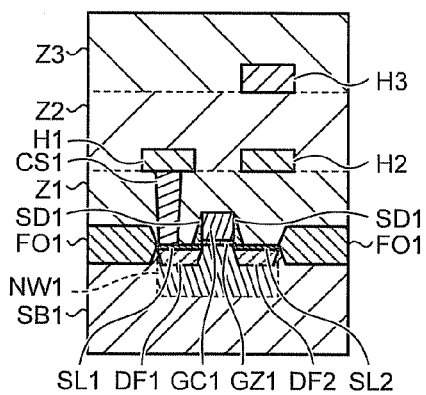

In all configurations shown in FIGS. 2B to 2D, '1' can be stored as the ROM data. Specifically, in the configuration shown in FIG. 2B, the contact electrode V2 shown in FIG. 2A is omitted. In the configuration shown in FIG. 2C, the contact electrode CS2 shown in FIG. 2A is omitted. In the configuration shown in FIG. 2D, the contact electrodes CS2 and V2 shown in FIG. 2A are omitted.

Figure 3A:
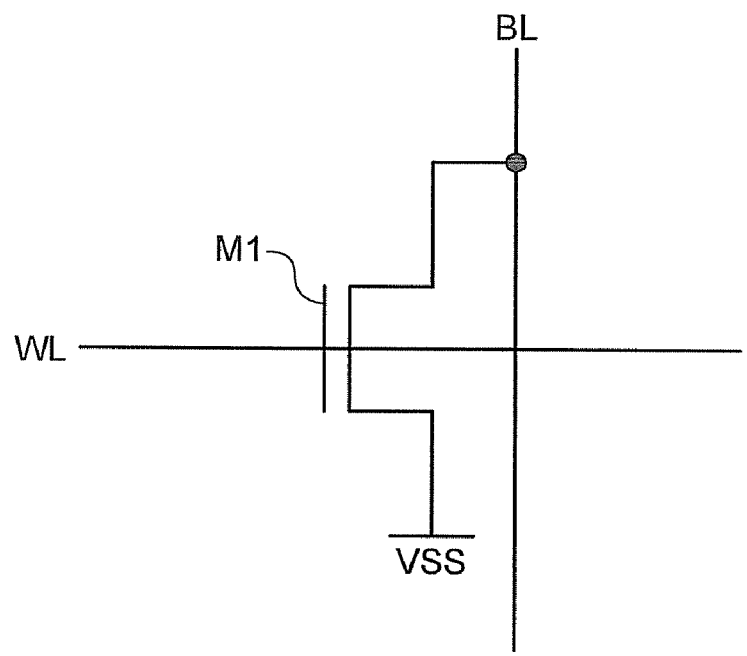
FIGS. 3A and 3B are diagrams of circuit configurations of memory cells applied to the semiconductor storage device according to the first embodiment.
Figure 3B:
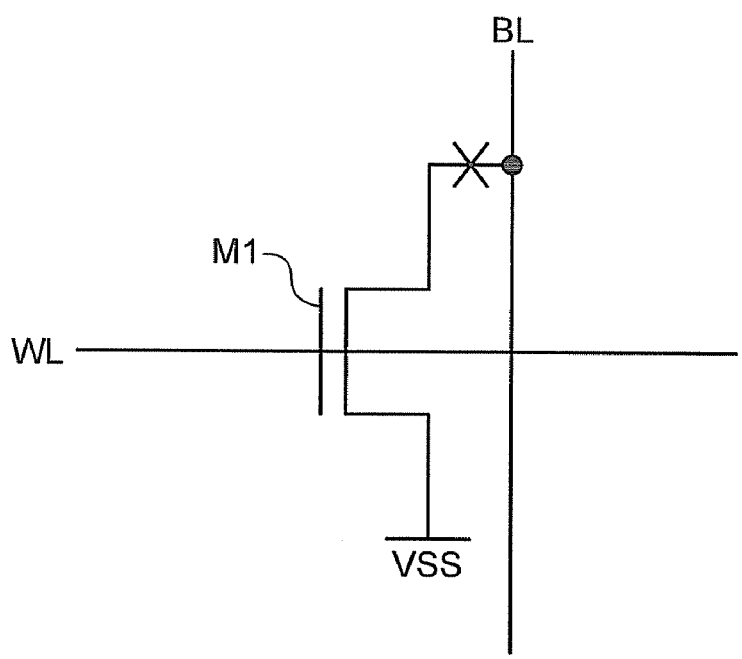

FIGS. 3A and 3B are diagrams of circuit configurations of memory cells applied to the semiconductor storage device according to the first embodiment.

In FIGS. 3A and 3B, a transistor M1 is provided in each of the memory cells. A gate of the transistor M1 can include the gate electrode GC1 shown in FIGS. 2A to 2D. A drain of the transistor M1 can include the diffusion layer DF2 shown in FIGS. 2A to 2D. A source of the transistor M1 can include the diffusion layer DF1 shown in FIGS. 2A to 2D.

As shown in FIG. 3A, in the configuration shown in FIG. 2A, the drain of the transistor M1 is connected to the bit line BL via the contact electrodes CS2 and V2. As shown in FIG. 3B, in the configurations shown in FIGS. 2B to 2D, the drain of the transistor M1 is separated from the bit line BL because at least one of the contact electrodes CS2 and V2 is omitted.

When data is read out from the memory cell, the bit line BL is pre-charged to high-level potential. The high-level potential is applied to the gate electrode GC1 via the word line WL and the transistor M1 is turned on. In the configuration shown in FIG. 2A, when the transistor M1 is turned on, the bit line BL is connected to the low-level potential VSS and the potential of the bit line BL shifts to the low-level potential VSS. Therefore, '0' is read out as the ROM data. On the other hand, in the configurations shown in FIGS. 2B to 2D, when the transistor M1 is turned on, the bit line BL is not connected to the low-level potential VSS and the potential of the bit line BL maintains the high-level potential. Therefore, '1' is read out as the ROM data.

'1' of the ROM data is represented by the configuration shown in any one of FIGS. 2B to 2D. Therefore, to decode the ROM data, it is necessary to observe, over a plurality of layers, presence or absence of the contact electrodes CS2 and V2. Consequently, it is possible to make it difficult to decode the ROM data from physical observation of a ROM chip and solve the vulnerability in terms of security of the ROM chip.

FIGS. 4A to 4C are sectional views of another example of the method of forming a memory cell applied to the semiconductor storage device according to the first embodiment.

In a configuration shown in FIG. 4A, the silicide layers SL1 and SL2 shown in FIG. 2A are omitted. In a configuration shown in FIG. 4B, the diffusion layers DF1 and DF2 shown in FIG. 2A are omitted. In a configuration shown in FIG. 4C, the N well NW1 shown in FIG. 2A is omitted.

The bit line BL and the low-level potential VSS cannot be completely separated by omitting the silicide layers SL1 and SL2, the diffusion layers DF1 and DF2, or the N well NW1. However, it is possible to increase the resistance of a connection path between the bit line BL and the low-level potential VSS.

Therefore, in the configurations shown in FIGS. 4A to 4C, even when the transistor M1 shown in FIG. 3A is turned on, it is possible to maintain the potential of the bit line BL at high-level potential over a fixed period and read out '1' as the ROM data.

'1' of the ROM data is represented by not only the configuration shown in any one of FIGS. 2B to 2D but also the configuration shown in any one of FIGS. 4A to 4C. Therefore, to decode the ROM data, it is necessary not only to observe presence or absence of the contact electrodes CS2 and V2 over a plurality of layers but also to observe presence or absence of the silicide layers SL1 and SL2, the diffusion layers DF1 and DF2, or the N well NW1. Consequently, it is possible to make it more difficult to decode the ROM data from physical observation of a ROM chip and solve the vulnerability in terms of security of the ROM chip.

In the example explained in the first embodiment, the contact electrodes are arranged in the two layers. However, the present invention can also be applied when there are N (N is an integer equal to or larger than 2) layers in which contact electrodes are arranged.

FIGS. 5A to 5C are plan views for explaining a method of forming a semiconductor storage device according to a second embodiment of the present invention. FIG. 5A is a diagram of an example of ROM data stored in the semiconductor storage device. FIG. 5B is a diagram of an arrangement example of contact electrodes V in a second layer. FIG. 5C is a diagram of an arrangement example of contact electrodes CS and CS12 in a first layer.

It is assumed that, in FIG. 5, for example, memory cells are arranged in a matrix shape in four rows in a row direction and six columns in a column direction. It is assumed that the memory cells are connected to the low-level potential VSS and a pair of memory cells adjacent to each other in the row direction share the contact electrode CS12 connected to the low-level potential VSS.

When the ROM data is '0', all the contact electrodes CS, CS12, and V are arranged in the memory cells. When the ROM data is '1', at least any one of the contact electrodes CS, CS2, and V is omitted.

Figure 6A:
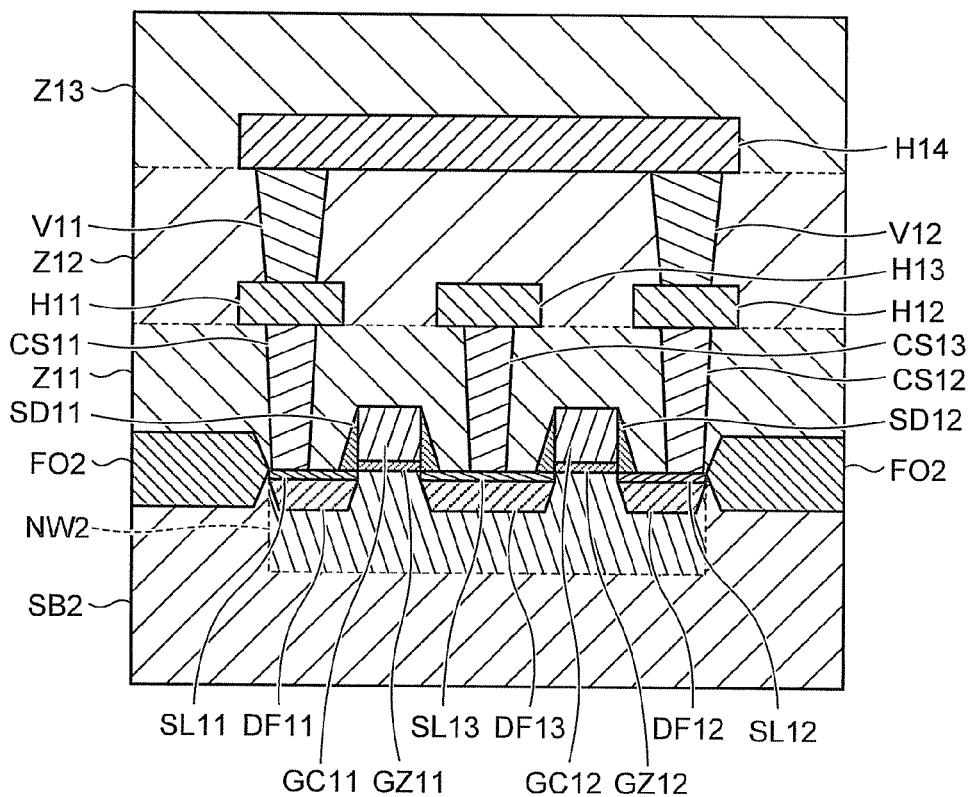
FIGS. 6A and 6B are sectional views for explaining a method of forming a memory cell applied to the semiconductor storage device according to the second embodiment.
Figure 6B:
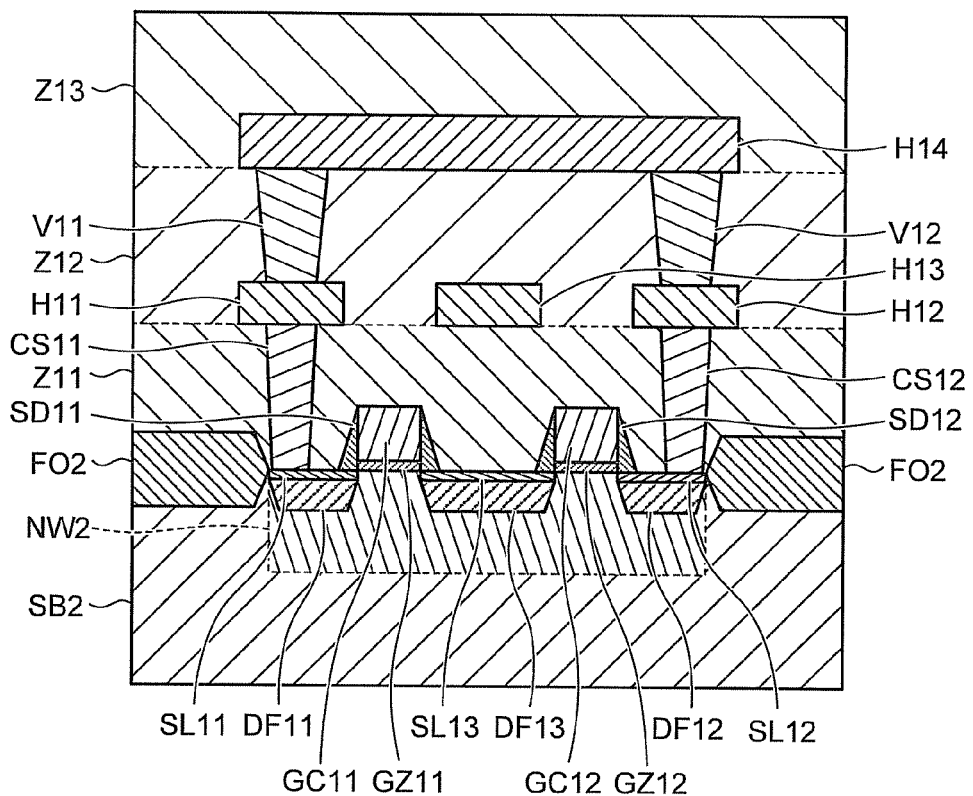

FIGS. 6A and 6B are sectional views for explaining a method of forming a memory cell applied to the semiconductor storage device according to the first embodiment.

In FIGS. 6A and 6B, device isolation insulating films FO2 are formed on a semiconductor substrate SB2. Each two memory cells adjacent to each other in the row direction are isolated by the device isolation insulating films FO2. An N well NW2 is formed in the semiconductor substrate SB2 in a device forming region isolated by the device isolation insulating films FO2. Gate electrodes GC11 and GC12 are formed on the N well NW2 respectively via gate insulating films GZ11 and GZ12.

Sidewalls SD11 and SD12 are respectively formed on the sidewalls of the gate electrodes GC11 and GC12. Diffusion layers DF11 and DF12 respectively arranged on one sides of the gate electrodes GC11 and GC12 are formed in the semiconductor substrate SB2. A diffusion layer DF13 arranged between the gate electrodes GC11 and GC12 is formed in the semiconductor substrate SB2. Consequently, a pair of transistors are formed.

Drains of the pair of transistors are separately formed in the diffusion layers DF11 and DF12. A source of the pair of transistors is formed in the diffusion layer DF13. Therefore, the source is shared by a pair of memory cells adjacent to each other in the row direction. Silicide layers SL11 to SL13 are respectively formed on the diffusion layers DF11 to DF13.

An interlayer insulating film Z11 is laminated on the gate electrodes GC11 and GC12. Wires H11 to H13 are formed on the interlayer insulating film Z11. Contact electrodes CS11 to CS13 that respectively connect the wires H11 to H13 to the silicide layers SL11 to SL13 are embedded in the interlayer insulating film Z11.

An interlayer insulating film Z12 is laminated on the wires H11 to H13. A wire H14 is formed on the interlayer insulating film Z12. Contact electrodes V11 and V12 that respectively connect the wire H14 to the wires H11 and H12 are embedded in the interlayer insulating film Z12. An interlayer insulating film Z13 is laminated on the wire H14.

The wire H14 can be connected to the bit line BL, the gate electrodes GC11 and GC12 can be respectively connected to word lines WL1 and WL, and the wire H13 can be connected to the low-level potential VSS. In a configuration shown in FIG. 6A, '00' (representing '0's adjacent to each other: the same notation is used in the following explanation) can be stored as the ROM data.

In a configuration shown in FIG. 6B, '11' can be stored as the ROM data. Specifically, in the configuration shown in FIG. 6B, the contact electrode CS13 shown in FIG. 6A is omitted. A method of storing '11' as the ROM data is not limited to the configuration shown in FIG. 6B. For example, with the contact electrode CS13 omitted, at least any one of the contact electrodes CS11 and CS12, the contact electrodes V11 and V12, the N well NW2, the diffusion layers DF11 to DF13, and the silicide layers SL11 to SL13 can be omitted.

Alternatively, as the method of storing '11' as the ROM data, without the contact electrode CS13 omitted, the contact electrodes CS11 and CS12 can be omitted, the contact electrodes V11 and V12 can be omitted, the contact electrodes CS11, CS12, V11, and V12 can be omitted, the N well NW2 can be omitted, the diffusion layer DF13 can be omitted, the silicide layer SL13 can be omitted, the diffusion layers DF11 and DF12 can be omitted, or the silicide layers SL11 and SL12 can be omitted.

As a method of storing '10' as the ROM data, without the contact electrode CS13 omitted, at least any one of the contact electrodes CS11 and V11, the diffusion layer DF11, and the silicide layer SL11 only has to be omitted.

As a method of storing '01' as the ROM data, without the contact electrode CS13 omitted, at least any one of the contact electrodes CS12 and V12, the diffusion layer DF12, and the silicide layer SL12 only has to be omitted.

In this embodiment, the method of omitting the contact electrode CS13 is added as the method of storing '11' as the ROM data. Consequently, it is possible to increase variations for representing the ROM data and make it more difficult to decode the ROM data from physical observation of a ROM chip.

Figure 7:
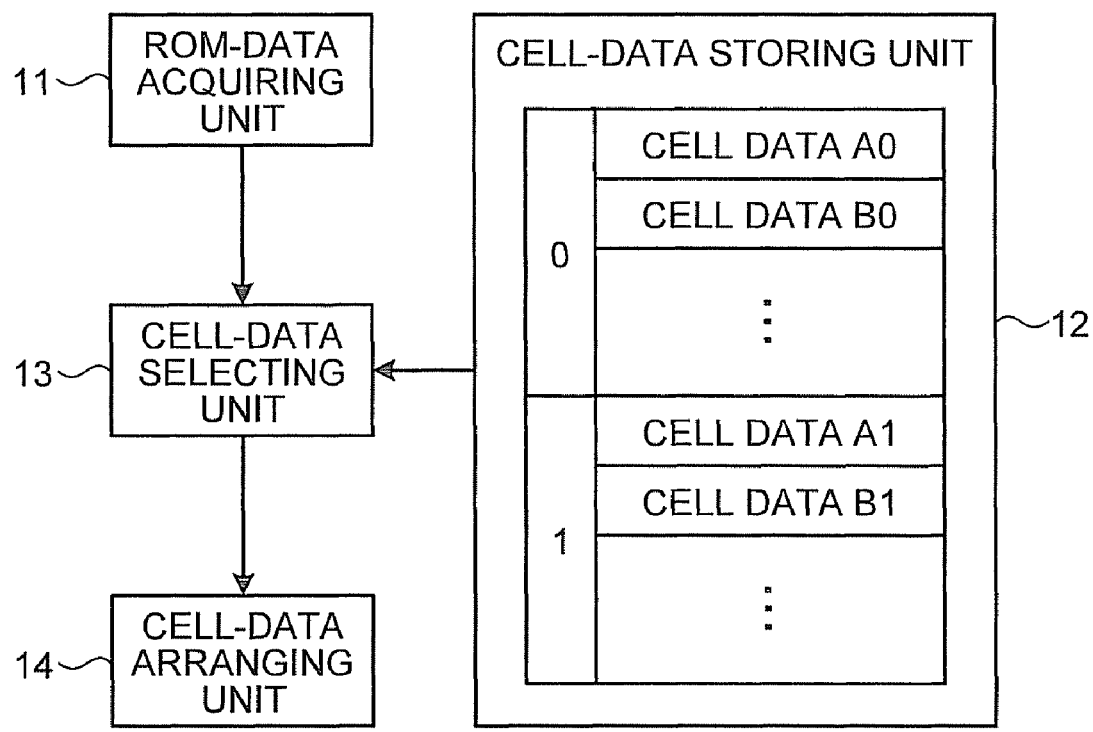
FIG. 7 is a block diagram of the schematic configuration of a ROM generator according to a third embodiment of the present invention.

FIG. 7 is a block diagram of the schematic configuration of a ROM generator according to a third embodiment of the present invention.

In FIG. 7, the ROM generator includes a ROM-data acquiring unit 11, a cell-data storing unit 12, a cell-data selecting unit 13, and a cell-data arranging unit 14. The ROM-data acquiring unit 11 can acquire ROM data '0' or '1'. The cell-data storing unit 12 can store a plurality of cell data respectively having different connection places in a connection path with respect to the same ROM data. Specifically, a plurality of cell data A0, B0, . . . are stored with respect to the ROM data '0' and a plurality of cell data A1, B1, . . . are stored with respect to the ROM data '1'. For example, cell data of the memory cell shown in FIG. 2A can be stored with respect to the ROM data '0'. Cell data of the memory cells shown in FIGS. 2B to 2D and FIGS. 4A to 4C can be stored with respect to the ROM data '1'. The cell-data selecting unit 13 can select, with respect to the same ROM data acquired by the ROM-data acquiring unit 11, a plurality of cell data stored in the cell-data storing unit 12. The cell-data arranging unit 14 can arrange the cell data selected by the cell-data selecting unit 13 to correspond to cell regions.

When ROM data is acquired by the ROM-data acquiring unit 11, the cell-data selecting unit 13 selects cell data corresponding to the ROM data. The cell-data arranging unit 14 arranges the cell data selected by the cell-data selecting unit 13 to correspond to the cell regions. Consequently, layout design data (GDS data) or mask data is generated.

As a method of selecting cell data with respect to the same ROM data, cell data can be selected at random out of a plurality of cell data or the cell data stored in the cell-data storing unit 12 can be selected in order.

It goes without saying that it is possible to easily realize a ROM generator including the cell-data storing unit 12 that stores a plurality of cell data A00, B00, . . . with respect to ROM data '00', stores a plurality of cell data A01, B01, . . . with respect to ROM data '01', stores a plurality of cell data A10, 310, . . . with respect to ROM data '10', and stores a plurality of cell data A11, B11, . . . with respect to ROM data '11' and the cell-data selecting unit 13 that selects cell data referring to ROM data adjacent to each other.

The ROM-data acquiring unit 11, the cell-data storing unit 12, and the cell-data arranging unit 14 can be realized by causing a computer to execute a computer program in which commands for realizing functions of these units are described. The ROM-data acquiring unit 11, the cell-data storing unit 12, the cell-data selecting unit 13, and the cell-data arranging unit 14 can be incorporated in a CAD system or the like that creates design layout data corresponding to layout patterns of layers of a semiconductor integrated circuit.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the sprit of the inventions. The accompanying claims and their equivalents are intended to cover such forms or modifications as would fall within the scope and spirit of the inventions.

What is claimed is:
1. A semiconductor storage device comprising:
   first to $2^N-1$th memory cells in which first to Nth (N is an integer equal to or larger than 2) disconnection places are respectively provided in positions different from one another on a connection path to a bit line, whereby '1' is written as ROM data; and
   a $2^N$th memory cell in which the connection path to the bit line is provided, whereby '0' is written as the ROM data.
2. The semiconductor storage device according to claim 1, wherein the first to $2^N$th memory cells are arranged in a matrix shape in a row direction and a column direction.

3. The semiconductor storage device according to claim 1, wherein
first to Nth contact electrodes are provided in layers different from one another in the connection path, and
the first to Nth contact electrodes are not respectively arranged in the first to Nth disconnection places.

4. The semiconductor storage device according to claim 1, wherein
the first to $2^N-1$th memory cells respectively include first to $2^N-1$th transistors disconnected from the bit line on the connection path, and
the $2^N$th memory cell includes a $2^N$th transistor connected to the bit line via the connection path.

5. The semiconductor storage device according to claim 1, wherein at least one of a contact electrode, a diffusion layer, a silicide layer, and a well is omitted in the disconnection places.

6. The semiconductor storage device according to claim 5, wherein the first to $2^N-1$th memory cells respectively have different combinations of a contact electrode, a diffusion layer, a silicide layer, and a well, at least one of which is omitted.

7. The semiconductor storage device according to claim 1, further comprising memory cell pairs that shares a source, wherein
the memory cell pairs include:
a first memory cell pair in which the connection path to the bit line is provided in both the memory cells, whereby '00' is written as the ROM data;
a second memory cell pair in which a disconnection place is provided in one memory cell on the connection path to the bit line, whereby '10' is written as the ROM data;
a third memory cell pair in which a disconnection place is provided in the other memory cell on the connection path to the bit line, whereby '01' is written as the ROM data; and
a fourth memory cell pair in which disconnection places are provided in both the memory cells on the connection path to the bit line, whereby '11' is written as the ROM data.

8. The semiconductor storage device according to claim 7, wherein at least one of a contact electrode, a diffusion layer, a silicide layer, and a well is omitted in the disconnection places.

9. The semiconductor storage device according to claim 8, wherein the second to fourth memory cell pairs include memory cell pairs that respectively have different combinations of a contact electrode, a diffusion layer, a silicide layer, and a well, at least one of which is omitted.

10. The semiconductor storage device according to claim 9, wherein the contact electrode connected to the source is omitted in the disconnection places of the fourth memory cell pair.

* * * * *